(12) United States Patent
Ooshima et al.

(10) Patent No.: US 9,383,726 B2
(45) Date of Patent: Jul. 5, 2016

(54) PHYSICAL QUANTITY MEASURING APPARATUS AND PHYSICAL QUANTITY MEASURING METHOD

(71) Applicant: YOKOGAWA ELECTRIC CORPORATION, Musashino-shi, Tokyo (JP)

(72) Inventors: Akihiro Ooshima, Musashino (JP); Tomohito Nouno, Musashino (JP)

(73) Assignee: YOKOGAWA ELECTRIC CORPORATION, Tokyo (JP)

( * ) Notice: Subject to any disclaimer, the term of this patent is extended or adjusted under 35 U.S.C. 154(b) by 528 days.

(21) Appl. No.: 13/900,774

(22) Filed: May 23, 2013

(65) Prior Publication Data

US 2013/0315366 A1   Nov. 28, 2013

(30) Foreign Application Priority Data

May 24, 2012  (JP) .................................. 2012-118458

(51) Int. Cl.
  *G04F 10/00* (2006.01)
  *H03K 21/02* (2006.01)
(52) U.S. Cl.
  CPC .............. *G04F 10/00* (2013.01); *H03K 21/023* (2013.01)
(58) Field of Classification Search
  CPC .................................................. G04F 10/00
  USPC ............................................................ 702/57
  See application file for complete search history.

(56) References Cited

U.S. PATENT DOCUMENTS

| 6,979,995 B2 * | 12/2005 | Horio | .................... G01L 9/0008 324/76.41 |
| 2008/0303571 A1 * | 12/2008 | Motoyui | .................. H03K 5/04 327/161 |

FOREIGN PATENT DOCUMENTS

| JP | 9-80091 A | 3/1997 |
| JP | 2004-198393 A | 7/2004 |

OTHER PUBLICATIONS

Snyder, JJ; "An Ultra-High Resolution Frequency Meter"; Proc. 35th Annual Freq. Control Symposium; Ft. Monmouth, NJ; May 1981, pp. 464-469.

* cited by examiner

*Primary Examiner* — Bryan Bui
(74) *Attorney, Agent, or Firm* — Sughrue Mion, PLLC

(57) ABSTRACT

A physical quantity measuring method includes: (a) generating a synchronized input signal from an input signal, wherein the synchronized input signal is synchronized with a reference clock; (b) measuring a total number ($N_{sum}$) that is the sum of pulses of the reference clock included in each of n units of the synchronized input signal; (c) generating 2n deviation signals based on a delay of the synchronized input signal with respect to the input signal; (d) generating a deviation integration signal by subtracting the total values of n rear-half deviation signals from the total values of n front-half deviation signals; (e) converting the deviation integration signal into a number of pulses of the reference clock; and (f) calculating the average number ($Nr_{ave}$) of pulses of the reference clock included in one unit of the input signal, based on the total number ($N_{sum}$), the number ($dN_{sum}$), and the number n.

8 Claims, 16 Drawing Sheets

PHYSICAL QUANTITY MEASURING APPARATUS AND PHYSICAL QUANTITY MEASURING METHOD

CROSS-REFERENCE TO RELATED APPLICATION

This application claims priority from Japanese Patent Applications No. 2012-118458, filed on May 24, 2012, the entire contents of which are herein incorporated by reference.

BACKGROUND

1. Technical Field

The present invention relates to a pulse counting technique for measuring a physical quantity, such as a frequency, of an input signal having continuous pulse train by measuring a pulse interval of the input signal by counting pulses of a reference clock.

2. Related Art

A physical quantity, such as a frequency, of an input signal having continuous pulse train can be measured by detecting rising or falling edges of the input signal and measuring its interval by counting pulses of a reference clock whose frequency is known. Physical quantity measuring apparatus such as frequency measuring apparatus and pulse interval measuring apparatus which utilize this pulse counting technique are now in practical use.

In general, an input signal varies asynchronously with a reference clock. Therefore, in physical quantity measuring apparatus, an input signal is converted into a synchronized input signal which is synchronized with a reference clock and edge intervals of the synchronized input signal are measured by counting pulses of the reference clock.

FIG. 13 is a block diagram showing the configuration of a frequency measuring apparatus 400 in a related-art physical quantity measuring apparatus. As shown in FIG. 13, the frequency measuring apparatus 400 includes a synchronization circuit 410, a counting circuit 420, and a calculation circuit 430. The frequency measuring apparatus 400 receives an input signal fin and a reference clock CLK and measures a frequency of the input signal fin.

The synchronization circuit 410 generates, from the input signal fin, a synchronized input signal Fin which is synchronized with the reference clock CLK. FIG. 14 is a timing chart illustrating a relationship between the reference clock CLK, the input signal fin, and the synchronized input signal Fin. In this example, in referring to the temporal relationship between the signals, a relationship between their pulse rising edges is used. This also applies throughout the following description.

When the input signal fin rises with certain timing, the synchronization circuit 410 generates a pulse when the reference clock CLK rises for the first time thereafter. The synchronized input signal Fin is generated as shown in FIG. 14 by repeatedly performing this processing.

The counting circuit 420 counts the number of pulses of the reference clock CLK in a period when rising edges of the synchronized input signal Fin is counted a prescribed number of times. As a result, a cycle ratio between the reference clock CLK and the synchronized input signal Fin is obtained. Since the frequency of the reference clock CLK is known, a frequency of the synchronized input signal Fin is calculated by the calculation circuit 430.

Since the synchronized input signal Fin is generated by synchronizing the input signal fin with the reference clock CLK, the calculation circuit 430 uses the calculated frequency of the synchronized input signal Fin as the frequency of the input signal fin and outputs the former as a frequency measurement result of the input signal fin.

In the example of FIG. 14, the number of pulses of the reference clock CLK are counted while five rising edges of the synchronized input signal Fin are counted, that is, during four cycles of the synchronized input signal Fin. Thirteen the reference clock CLK are counted during cycles F1-F4 of the synchronized input signal Fin. This means that the cycle of the synchronized input signal Fin is 13/4 times that of the reference clock CLK. Therefore, if the frequency of the reference clock CLK is 100 MHz, the frequency of the synchronized input signal Fin is calculated as follows.

100 MHz÷(13/4)=30.8 MHz.

The calculation circuit 430 outputs 30.8 MHz as a measurement result of the frequency of the input signal fin.

In general, to minimize a measurement error, the frequency measuring apparatus 400 performs plural measurements and outputs, as a measurement result, an average of measured values. In this case, if the next measurement is performed after completion of one measurement, a total measurement time becomes long and the real-time measurement cannot be performed. This problem can be solved, that is, the total measurement time can be shortened, by parallel counting with measurement period shifting.

However, where parallel counting is performed, k counters for counting the number of reference clocks are required to calculate an average of k measurement values, for example. Non-patent document 1 discloses a technique for avoiding such a complicated configuration. The number of measurements is set equal to the number n of cycles of a synchronized input signal Fin which is used for counting the number of reference clocks. With this measure, it is possible to count the number of pulses of the reference clock with a single counter. An average of n measurement values can be obtained through addition and subtraction operations.

As shown in FIG. 5, consideration will be given to a case of calculating a total number <N> of reference clocks in a period when (n+1) rising edges of a synchronized input signal Fin are counted, that is, counting operation in n cycles (called one unit) of the synchronized input signal Fin, is performed n times while the measurement period is shifted. It is assumed that each measurement period starts every time the synchronized input signal Fin rises. For example, the number n can be set equal to the number of rising edges of the synchronized input signal Fin in a prescribed reference time T.

Let Cc(i) represent the number of pulses of the reference clock CLK obtained in the i-th measurement. Then, an average $<N_{av}>$ over n-times measurements is given by Equation (1):

$$\langle N_{av} \rangle = \frac{1}{n} \sum_{i=1}^{n} Cc(i) \qquad (1)$$

Let $P_k$ represent the number of pulses of the reference clock CLK at a time point when the k-th rising edge of the synchronized input signal Fin has occurred (its rising edge at the start of the measurement is the first rising edge). Then, relationships $Cc(1)=P_{n+1}-P_1$, $Cc(2)=P_{n+2}-P_2$, ..., $Cc(n)=P_{2n}-P_n$ hold. $P_1$ to $P_n$ are the counted values of the reference clocks CLK during the first to n-th measurements, respectively. $P_{n-1}$ to $P_{2n}$ are counted values of the reference clocks CLK during the (n+1)-th to 2n-th measurements, respectively.

Equation (1) can be modified into Equation (2) using the $P_k$. In Equation (2), $\langle N_{sum} \rangle$ is a total number ($\Sigma Cc(i)$) of pulses of the reference clock CLK in the n-times measurements.

$$\langle N_{av} \rangle = \frac{1}{n} \sum_{i=1}^{n} Cc(i) \qquad (2)$$

$$= \frac{1}{n} \{Cc(1) + Cc(2) + \ldots + Cc(n)\}$$

$$= \frac{1}{n} \{(P_{n+1} - P_1) + (P_{n+2} - P_2) + \ldots + (P_{2n} - P_n)\}$$

$$= \frac{1}{n} \left( -\sum_{i=1}^{n} P_i + \sum_{i=n+1}^{2n} P_i \right)$$

$$= \frac{1}{n} \langle N_{sum} \rangle$$

As seen from Equation (2), a total number $\langle N_{sum} \rangle$ of pulses of the reference clock CLK in the n-times measurements can be obtained by subtracting the sum of the count values $P_1$ to $P_n$ from the sum of the count values $P_{n+1}$ to $P_{2n}$.

As described above, by setting the number of measurements equal to the number n of cycles of the synchronized input signal Fin, it becomes unnecessary to count the reference clock CLK for each of the n-times measurements and, instead, it is necessary for only one counter for counting the reference clock CLK from the start of the measurement.

Once the total number $\langle N_{sum} \rangle$ of pulses of the reference clock CLK that are counted in the n-times measurements each of which is performed in a period of n cycles of the synchronized input signal Fin is obtained, since an average $\langle N_{av} \rangle$ per measurement is given by $\langle N_{sum} \rangle/n$, a frequency $v_{Fin}$ is calculated according to Equation (3). In Equation (3), $v_{CLK}$ is the frequency of the reference clock CLK.

$$v_{Fin} = \frac{n}{\left(\frac{\langle N_{sum} \rangle}{n}\right)} v_{CLK} \qquad (3)$$

$$= \frac{n^2}{-\sum_{i=1}^{n} P_i + \sum_{i=n+1}^{2n} P_i} v_{CLK}$$

[Patent document 1] JP-A-2004-198393

[Non-patent document 1] J. J. Snyder, "An Ultra-high Resolution Frequency Meter," Proc. 35th Ann. Freq. Control Symposium, USAERADCOM, Ft. Monmouth, N.J., 07703, May 1981.

As described above, by setting the number of measurements equal to the number of cycles of the synchronized input signal Fin, it become sufficient to use only one counter for counting the number of pulses of the reference clock and an average of the ratio between the cycle of the reference clock CLK and that of the synchronized input signal Fin can be obtained through addition and subtraction operations.

However, since the synchronized input signal Fin is generated by synchronizing the input signal fin with the reference clock CLK, as shown in FIG. 16 corresponding rising edges of the input signal fin and the synchronized input signal Fin are deviated from each other by a value that is smaller than the cycle of the reference clock CLK.

More specifically, a one-unit measurement length of the synchronized input signal Fin which is used for counting and the length of a corresponding part of the input signal fin (real length) has a deviation that depends on a front deviation and a rear deviation. Whereas the front deviation and the rear deviation are such quantities as to make the one-unit measurement length of the synchronized input signal Fin shorter and longer than the length of the corresponding part of the input signal fin (real length), respectively, the difference between the front deviation and the rear deviation results in an error.

Since an error included in the conversion from an input signal into a synchronized input signal finally appears as an error of a measurement result frequency, it is desirable that the conversion error be as small as possible. One method for decreasing the conversion error is to set the frequency of a reference clock higher. However, this is not preferable because it increases the power consumption. Furthermore, the frequency of a reference clock cannot be increased easily because it has a certain upper limit due to other restrictions.

SUMMARY OF THE INVENTION

One or more illustrative aspects of the present invention are to increase the accuracy of a measurement in which a pulse interval of an input signal having continuous pulse train is measured by counting the number of reference clocks, without increasing the frequency of the reference clock.

According to one or more aspects of the present invention, there is provided a physical quantity measuring apparatus (100). The apparatus comprises: a synchronization unit (110) configured to generate a synchronized input signal from an input signal having a continuous pulse train, wherein the synchronized input signal is synchronized with a reference clock; a counter (120) configured to measure a total number ($N_{sum}$) that is the sum of pulses of the reference clock included in each of n units of the synchronized input signal, wherein each unit of the synchronized input signal has n cycles of the synchronized input signal, and n is a positive integer of 1 or more; a deviation signal generator (141) configured to generate 2n deviation signals based on a delay of the synchronized input signal with respect to the input signal; a deviation integrating unit (142) configured to generate a deviation integration signal by subtracting the total values of n rear-half deviation signals from the total values of n front-half deviation signals in the 2n deviation signals; a compensation counter (143) configured to convert the deviation integration signal into a number ($dN_{sum}$) of pulses of the reference clock; and a calculator (130) configured to calculate the average number ($Nr_{ave}$) of pulses of the reference clock included in one unit of the input signal, based on the total number ($N_{sum}$), the number ($dN_{sum}$), and the number n, wherein one unit of the input signal has n cycles of the input signal.

According to one or more aspects of the present invention, there is provided a physical quantity measuring apparatus. The apparatus comprises: a synchronization unit (110) configured to generate a synchronized input signal from an input signal having a continuous pulse train, wherein the synchronized input signal is synchronized with a reference clock; a counter (120) configured to measure a total number ($N_{sum}$) that is the sum of pulses of the reference clock included in each of n units of the synchronized input signal, wherein each unit of the synchronized input signal has n cycles of the synchronized input signal, and n is a positive integer of 1 or more; a deviation signal generator (141) configured to generate 2n deviation signals based on a delay of the synchronized input signal with respect to the input signal; a front-half deviation integrating unit (142a) configured to generate a front-half deviation integration signal by adding respective values of n front-half deviation signals in the 2n deviation signals; a rear-half deviation integrating unit (142b) configured to generate a rear-half deviation integration signal by adding respective values of n rear-half deviation signals in the 2n deviation signals; a front-half compensation counter (143a) configured to convert the front-half deviation integration signal into a number (dNa) of pulses of the reference clock; a rear-half compensation counter (143b) configured to convert the rear-half deviation integration signal into a number (dNb) of pulses of the reference clock; and a calculator (130) configured to calculate the average number ($Nr_{ave}$) of pulses of the reference clock included one unit of the input signal, based on the total number ($N_{sum}$), the number (dNa), the number (dNb), and the number n, wherein one unit of the input signal has n cycles of the input signal.

According to one or more aspects of the present invention, there is provided a physical quantity measuring method. The method comprises: (a) generating a synchronized input signal from an input signal having a continuous pulse train, wherein the synchronized input signal is synchronized with a reference clock; (b) measuring a total number ($N_{sum}$) that is the sum of pulses of the reference clock included in each of n units of the synchronized input signal, wherein each unit of the synchronized input signal has n cycles of the synchronized input signal, and n is a positive integer of 1 or more; (c) generating 2n deviation signals based on a delay of the synchronized input signal with respect to the input signal; (d) generating a deviation integration signal by subtracting the total values of n rear-half deviation signals from the total values of n front-half deviation signals in the 2n deviation signals; (e) converting the deviation integration signal into a number ($dN_{sum}$) of pulses of the reference clock; and (f) calculating the average number ($Nr_{ave}$) of pulses of the reference clock included in one unit of the input signal, based on the total number ($N_{sum}$), the number ($dN_{sum}$), and the number n, wherein one unit of the input signal has n cycles of the input signal.

DETAILED DESCRIPTION OF EXEMPLARY EMBODIMENTS

An embodiment of the present invention will be hereinafter described with reference to the drawings. The embodiment is directed to a frequency measuring apparatus. However, the application field of the invention is not limited to frequency measuring apparatus and the invention can be applied to general physical quantity measuring apparatus which have a configuration for measuring a pulse interval of an input signal having continuous pulse train by counting pulses of a reference clock. Such physical quantity measuring apparatus include apparatus for counting pulses in a prescribed period, pulse interval measuring apparatus, etc.

Figure 1:
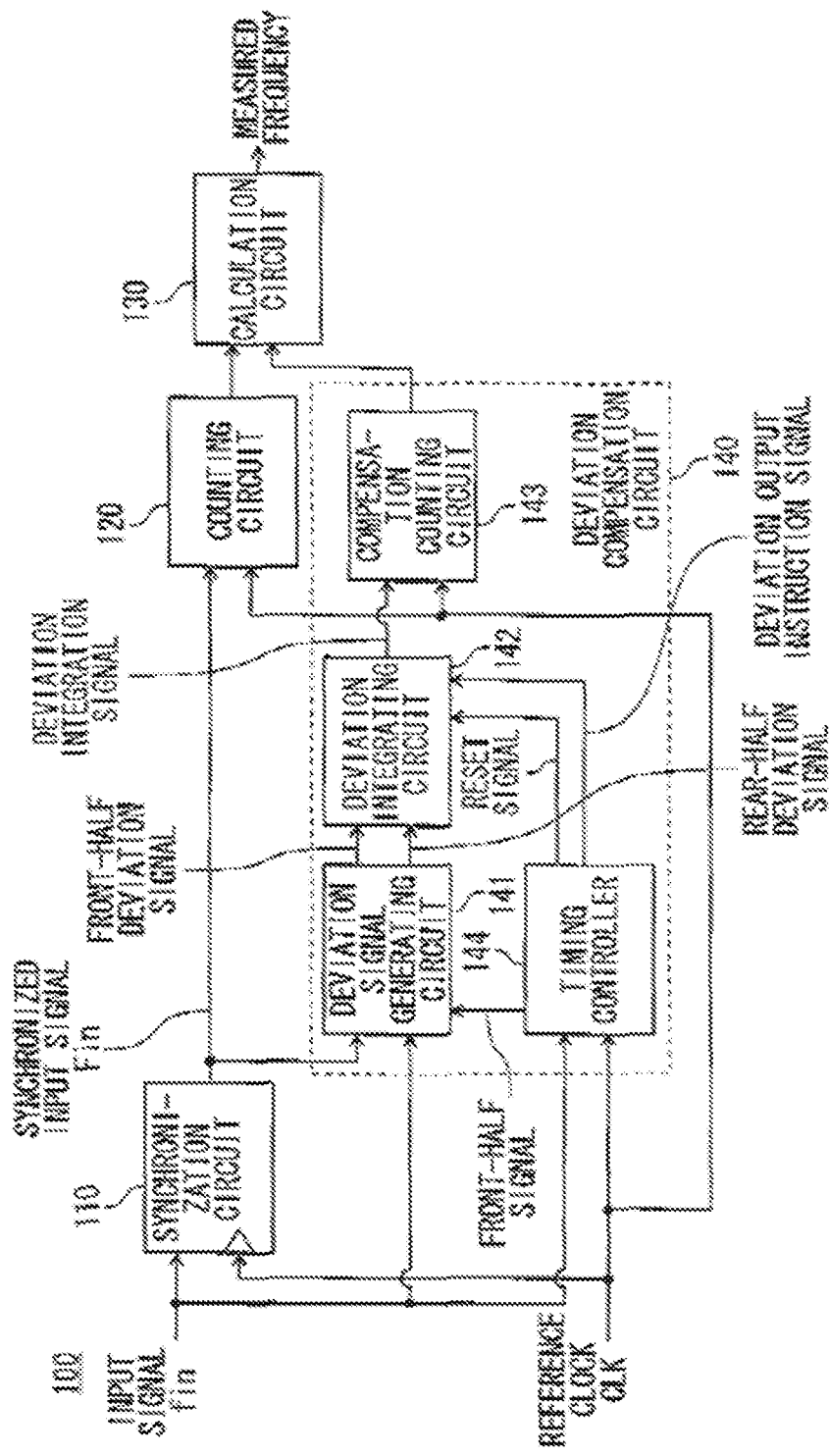
FIG. 1 is a block diagram showing the configuration of a frequency measuring apparatus according to an embodiment.

FIG. 1 is a block diagram showing the configuration of a frequency measuring apparatus 100 according to the embodiment. As shown in FIG. 1, the frequency measuring apparatus 100 includes a synchronization circuit 110, a counting circuit 120, a calculation circuit 130, and a deviation compensation circuit 140. The frequency measuring apparatus 100 receives an input signal fin having continuous pulse train and a reference clock CLK and measures a frequency of the input signal fin. It is assumed that the input signal fin varies asynchronously with the reference clock CLK.

Like the related-art synchronization circuit 410, the synchronization circuit 110 generates, from the input signal fin, a synchronized input signal Fin which is synchronized with the reference clock CLK.

The counting circuit 120 measures a total number <$N_{sum}$> of pulses of the reference clock CLK according to Equation (2) by performing, n times, a measurement of counting the reference clock CLK in n cycles (1 unit) of the synchronized input signal Fin.

More specifically, let $P_k$ represent the number of pulses of the reference clock CLK at a time point when the k-th rising edge of the synchronized input signal. Fin has occurred (its rising edge at the start of the measurement is the first rising edge). $P_1$ to $P_n$ are count values of the reference clock CLK at the first to n-th measurements, respectively. $P_{n+1}$ to $P_{2n}$ are count values of the reference clock CLK at the (n+1)-th to 2n-th measurements, respectively. A total number <$N_{sum}$> of pulses of the reference clock CLK included in the n-times measurements can be obtained by subtracting the sum of the count values $P_1$ to $P_n$ from the sum of the count values $P_{n+1}$ to $P_{2n}$. Thus, the counting circuit 120 is merely required to perform simple addition and subtraction operations.

The deviation compensation circuit 140 is configured to compensate for deviations included when the input signal fin is converted into the synchronized input signal Fin.

Figure 16:
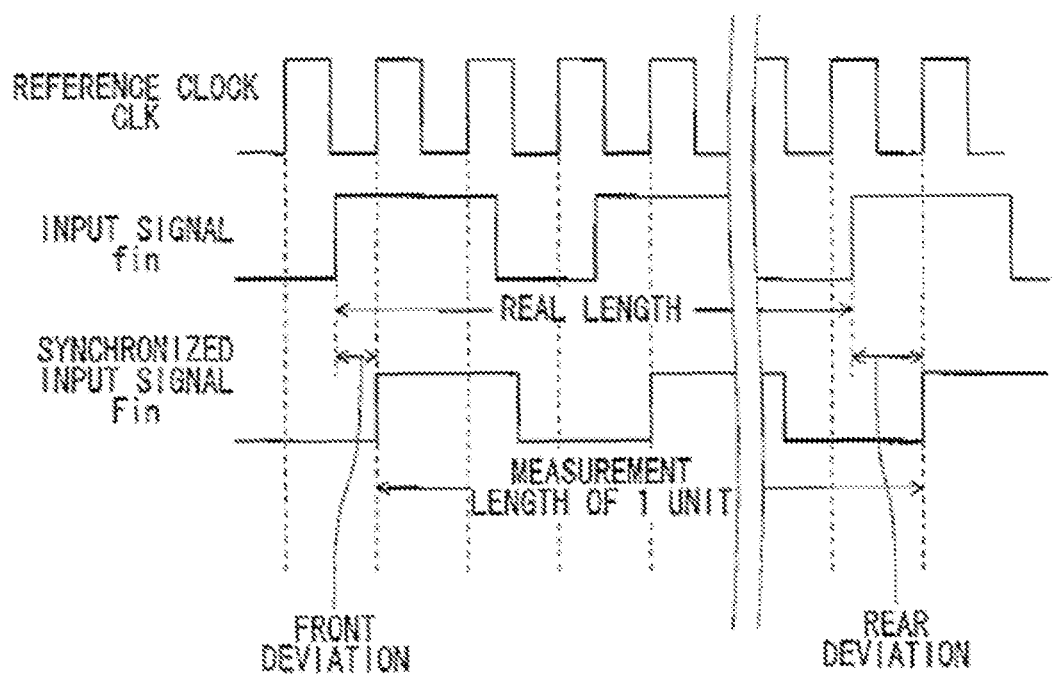
FIG. 16 a timing chart illustrating a deviation between an input signal and a synchronized input signal.

A deviation compensation method used in the embodiment will be described below. The counting circuit 120 counts the number of pulses of the reference clock CLK included in n units of the synchronized input signal Fin. However, as described above with reference to FIG. 16, a front deviation and a rear deviation occur for each unit when the input signal fin is converted into the synchronized input signal Fin.

Figure 2:
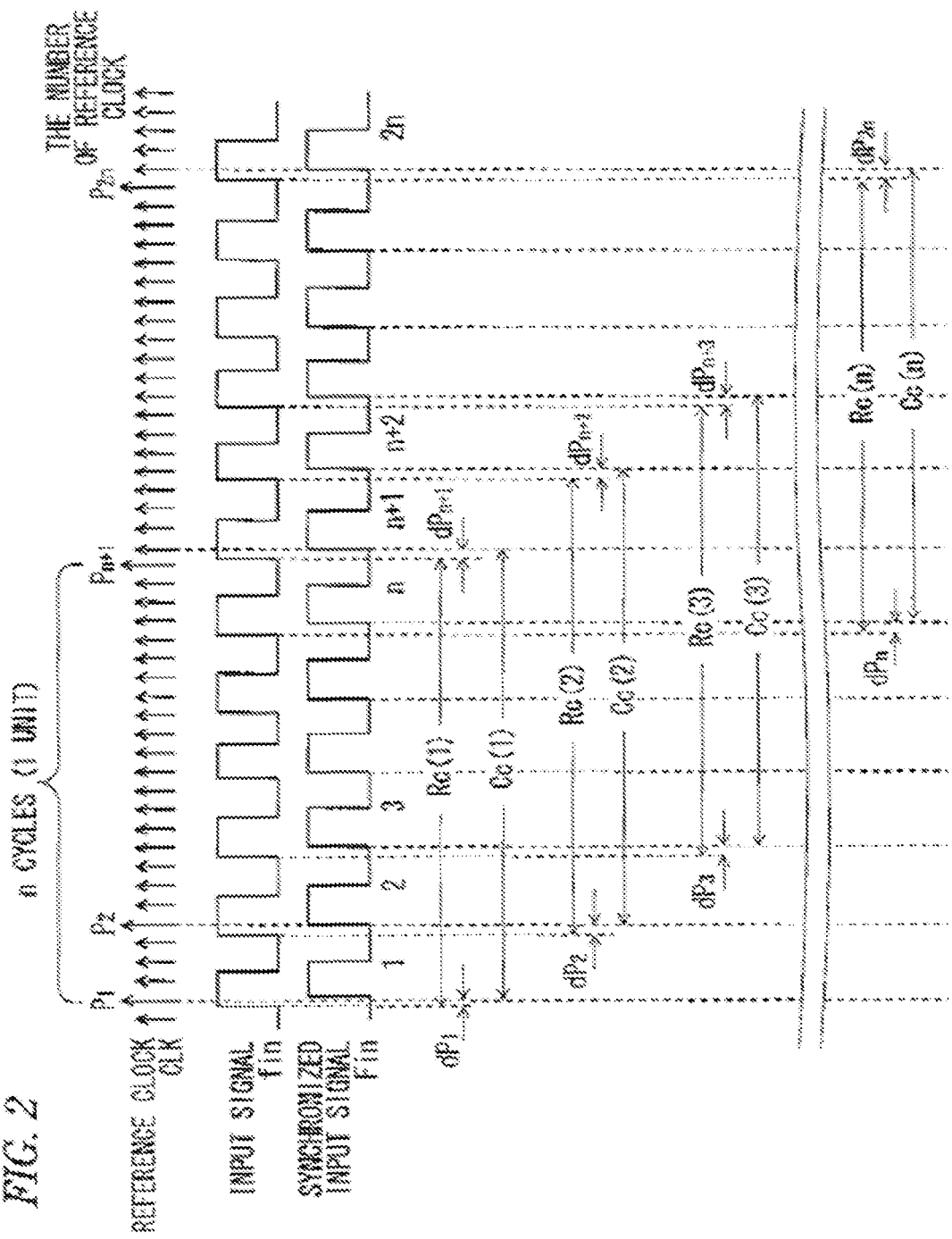
FIG. 2 is a timing chart illustrating deviations of each unit period.

Let Rc(i) represent the number of pulses of the reference clock CLK in the one unit of the input signal fin in an i-th measurement. Then, as shown in FIG. 2, Rc(i) is given by Equation (4). In Equation (4), Cc(i) is the number of pulses of the reference clock CLK included in the one unit of the synchronized input signal Fin in an i-th measurement.

$$Rc(i)CC(i)+dP_1+dP_{n+1} \quad (4)$$

where $dP_i$ and $dP_{n+i}$ are the number of pulses of the reference clock CLK included in the period of the front deviation and the period of the rear deviation, respectively. However, $dP_i$ and $dP_{n+i}$ are smaller than 1 because they are deviations.

Therefore, for an average $<N_{av}>$ of n-times measurements, a real average $<Nr_{av}>$ of a case without a conversion error is given by Equation (5). $<Nr_{av}>$ represents an average number of the reference clock CLK included in one unit of the input signal fin, and is an actual parameter to be measured.

$$\begin{aligned}
\langle Nr_{av}\rangle &= \frac{1}{n}\sum_{i=1}^{n} Rc(i) \\
&= \frac{1}{n}\{(Cc(1) + dP_1 - dP_{n+1}) + \ldots + (Cc(n) + dP_n - dP_{2n})\} \\
&= \frac{1}{n}\{P_{n+1} - P_1 + dP_1 - dP_{n+1}) + \ldots + \\
&\quad (P_{2n} - P_n + dP_n - dP_{2n})\} \\
&= \frac{1}{n}\left(-\sum_{i=1}^{n} P_i + \sum_{i=n+1}^{2n} P_i\right) + \frac{1}{n}\left(\sum_{i=1}^{n} dP_i - \sum_{i=n+1}^{2n} dP_i\right) \\
&= \frac{1}{n}\langle N_{sum}\rangle + \frac{1}{n}\langle dN_{sum}\rangle
\end{aligned} \quad (5)$$

That is, the average number $<Nr_{av}>$ of pulses of the reference clock CLK included in one unit of the input signal fin is equal to a value obtained by dividing the sum of $<N_{sum}>$ and $<dN_{sum}>$ by n. As given by Equation (6), $<dN_{sum}>$ is a value obtained by subtracting the sum of n rear half deviation from the sum of n front half deviation (a total of 2n deviations occur in the n-times measurements).

$$\langle dN_{sum}\rangle = \left(\sum_{i=1}^{n} dP_i - \sum_{i=n+1}^{2n} dP_i\right) \quad (6)$$

In the frequency measuring apparatus 100 according to the embodiment, the counting circuit 120 is a circuit for measuring $<N_{sum}>$ and the deviation compensation circuit 140 is a circuit for measuring $<dN_{sum}>$.

As shown in FIG. 1, to measure $<dN_{sum}>$, the deviation compensation circuit 140 includes a deviation signal generating circuit 141, a deviation integrating circuit 142, a compensation counting circuit 143, and a timing controller 144.

The deviation signal generating circuit 141 outputs an H-level front-half deviation signal corresponding to the magnitude of each front-half deviation and an H-level rear-half deviation signal corresponding to the magnitude of each rear-half deviation. The deviation integrating circuit 142 is configured to add values of front-half deviation signals and subtract values of rear-half deviation signals. An integration result is output as a pulse width of a deviation integration signal. The compensation counting circuit 143 converts, into $<dN_{sum}>$, the pulse width of the deviation integration signal which is the integration result of the deviation integrating circuit 142.

The timing controller 144 is configured to control the timing of the deviation signal generating circuit 141 and the deviation integrating circuit 142. More specifically, the timing controller 144 outputs a front-half signal indicating that the present time in the front half of a frequency measurement period to the deviation signal generating circuit 141. The timing controller 144 also outputs, to the deviation integrating circuit 142, a reset signal for resetting an integration result and a deviation output instruction signal for causing output of an integration result.

The calculation circuit 130 calculates a real value $<Nr_{av}>$ per unit of a case that there is no conversion error on the basis of $<N_{sum}>$ which is output from the counting circuit 120 and $<dN_{sum}>$ which is output from the deviation compensation circuit 140. Furthermore, the calculation circuit 130 calculates a frequency of the input signal fin.

$<Nr_{av}>$ is given by the above-mentioned Equation (5). A frequency $v_{fin}$ is calculated according to Equation (7) where $v_{CLK}$ is the frequency of the reference clock CLK.

$$\begin{aligned}
v_{fin} &= \frac{n}{\frac{\langle N_{sum}\rangle}{n} + \frac{\langle dN_{sum}\rangle}{n}} v_{CLK} \\
&= \frac{n^2}{\langle N_{sum}\rangle + \langle dN_{sum}\rangle} v_{CLK}
\end{aligned} \quad (7)$$

Figure 3:
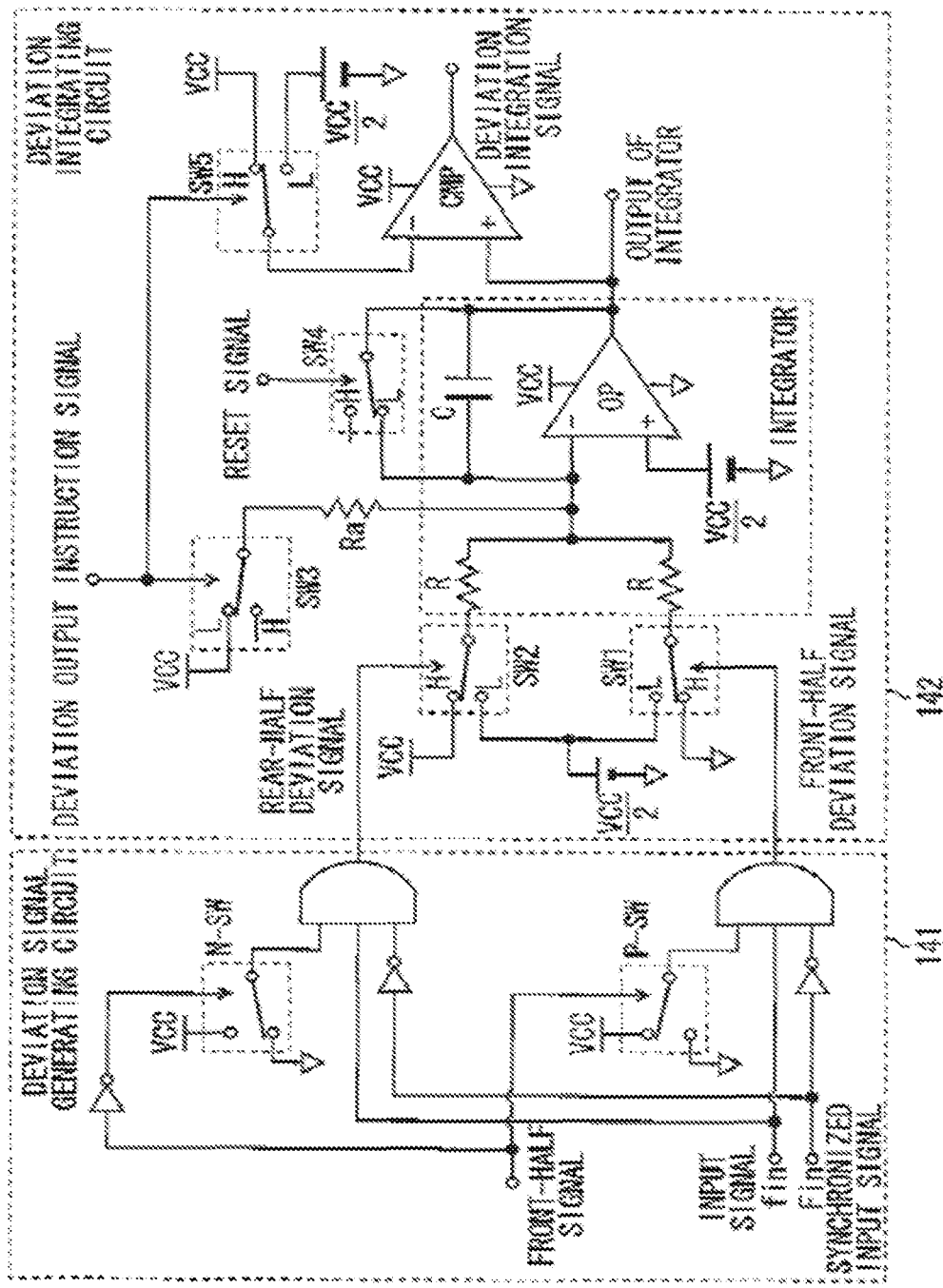
FIG. 3 is a circuit diagram showing example configurations of a deviation generating circuit and a deviation integrating circuit.

FIG. 3 is a circuit diagram showing example configurations of the deviation signal generating circuit 141 and the deviation integrating circuit 142. As shown in FIG. 3, in the deviation signal generating circuit 141, a switch P-SW is switched to Vcc while the front-half signal is enable and a switch N-SW is switched to Vcc while the front-half signal is disable. As a result, while the front-half signal is enable, the deviation signal generating circuit 141 outputs an H-level front-half deviation signal to the deviation integrating circuit 142 if the input signal fin is at the H (high) level and the synchronized input signal Fin is at the L (low) level. While the front-half signal is disable, the deviation signal generating circuit 141 outputs an H-level rear-half deviation signal to the deviation integrating circuit 142 if the input signal fin is at the H level and the synchronized input signal Fin is at the L level.

The deviation integrating circuit 142 includes an integrator which is composed of an operational amplifier OP, a capacitor C, and two parallel-connected resistors R. One resistor R is connected to a switch SW1 which is switched from Vcc/2 to the ground when an H-level front-half deviation signal arrives. The other resistor R is connected to a switch SW2 which switched from Vcc/2 to Vcc when an H-level rear-half deviation signal arrives. Therefore, a value corresponding to each H-level front-half deviation signal is added to the output of the integrator which serves to charge the capacitor C and a value corresponding to each H-level rear-half deviation signal is subtracted from the output of the integrator. The output of the integrator is reset to the reference voltage Vcc/2 when the reset signal turns from H to L.

When the deviation output instruction signal turns from H to L, a switch SW3 is switched to Vcc, the charge that has been stored in the capacitor C as a result of integration is discharged via a resistor Ra with a time constant RaC. The discharge time corresponds to the charge stored in the capacitor C, that is, an integration value of addition values of the H-level front-half deviation signals and addition values of H-level rear-half deviation signals.

While the deviation output instruction signal is at the L level, a switch SW5 is kept switched to Vcc/2 rather than Vcc and hence the output of the integrator is compared with Vcc/2 by a comparator CMP. A deviation integration signal is output until the output of the integrator becomes lower than or equal to Vcc/2. Therefore, a time from a time point when the switch SW5 is switched from Vcc to Vcc/2 and the deviation integration signal turns to H to a time point when the output of the integrator becomes lower than or equal to Vcc/2 and the deviation integration signal turns to L corresponds to the integration result. However, in the above description, for the sake of simplicity, it is assumed that the output of the integrator is higher than Vcc/2 so that the comparator CMP operates. The deviation output instruction signal is changed to H after the deviation integration signal turns to L.

More specifically, since $dP_1, dP_2, \ldots, dP_{2n}$ are deviations of the number of pulses of the reference clock CLK, they are given by Formulae (8) where $v_{CLK}$ is the frequency of the reference clock CLK:

$$\frac{dP_1}{v_{CLK}}, \frac{dP_2}{v_{CLK}}, \ldots, \frac{dP_{2n}}{v_{CLK}} \tag{8}$$

Since the reference voltage is set at Vcc/2, an output $V_{1-2n}$ of the integrator that is obtained when the addition of H-level front-half deviation signals and the subtraction of H-level rear-half deviation signals have been completed is given by Equation (9). In Equation (9), the second term and the third term on the right side are an additive integration value of H-level front-half deviation signals and a subtractive integration of H-level rear-half deviation signals, respectively.

$$V_{1-2n} = \frac{Vcc}{2} + \frac{Vcc \sum_{i=1}^{n} dP_i}{2RCv_{CLK}} - \frac{Vcc \sum_{i=n+1}^{2n} dP_i}{2RCv_{CLK}} \tag{9}$$

As mentioned above, the following description will be made with an assumption that the output of the integrator is larger than Vcc/2, that is, Inequality (10) holds.

$$\frac{Vcc \sum_{i=1}^{n} dP_i}{2RCv_{CLK}} - \frac{Vcc \sum_{i=n+1}^{2n} dP_i}{2RCv_{CLK}} > 0 \tag{10}$$

$$\therefore \sum_{i=1}^{n} dP_i - \sum_{i=n+1}^{2n} dP_i > 0$$

The output $V_{1-2n}$ of the integrator is output from the deviation integrating circuit 142 in response to the deviation output instruction signal as a deviation integration signal having a pulse width $T_o$ (sec) which is given by Equation (11). That is, the pulse width $T_o$ indicates the integration result of the deviation signals.

$$T_o = \frac{R_a}{v_{CLK}} \left( \frac{\sum_{i=1}^{n} dP_i}{R} - \frac{\sum_{i=n+1}^{2n} dP_i}{R} \right) \tag{11}$$

$$= \frac{A}{v_{CLK}} \left( \sum_{i=1}^{n} dP_i - \sum_{i=n+1}^{2n} dP_i \right)$$

where Ra is equal to AR. The parameter A is a time expansion factor and can be determined theoretically or experimentally. In general, when the factor A is increased, the resolution increases but the measurement speed lowers.

The pulse width $T_o$ is converted into the number $<dN_1>$ of pulses of the reference clock CLK, which is given by Equation (12). In Equation (12), "int" is an operator of discarding decimal places.

$$<dN_1> = \text{int}(T_o v_{CLK}) \tag{12}$$

Then, the calculation circuit 130 calculates a frequency $v_{fin}$ (Hz) of the input signal fin according to Equation (13) on the basis of $<N_{sum}>$ counted by the counting circuit 120 and $<dN_1>$ ($\cong <dN_{sum}>$) calculated by the compensation counting circuit 143:

$$v_{fin} = \frac{n}{\frac{\langle N_{sum} \rangle}{n} + \frac{\langle dN_1 \rangle}{nA}} v_{CLK} \tag{13}$$

As described above, the frequency measuring apparatus 100 according to the embodiment calculates a frequency of an input signal by correcting a counting result of the counting circuit 120 taking into consideration deviations included in converting the input signal into a synchronized input signal. Therefore, the measurement accuracy can be increased without increasing the frequency of a reference clock.

Figure 4:
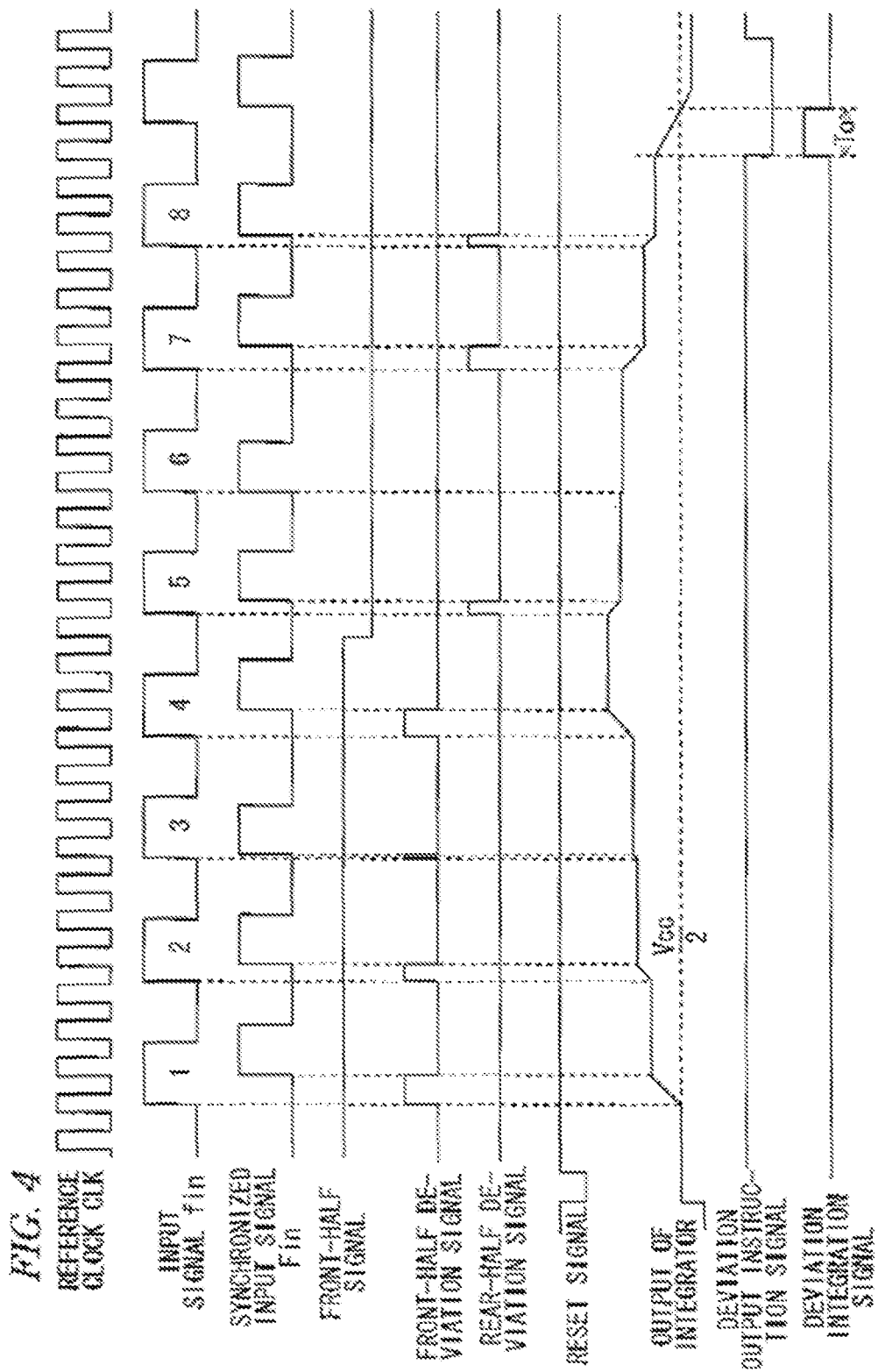
FIG. 4 is a liming chart showing example waveforms of respective signals in deviation processing.

FIG. 4 is a timing chart showing example waveforms of respective signals in the above-described deviation processing. In this example, values of four (=n) front-half deviation signals are added and values of four (=n) rear-half deviation signals are subtracted for eight (=2n) pulses of an input signal fin.

When the output of the integrator is reset to Vcc/2 by a reset signal, since the front-half signal is enable, H-level front-half deviation signals are output. Every time an H-level front-half deviation signal is output, its value is added and the output of the integrator is thereby increased. After the front-half signal becomes disable, rear-half deviation signals are output. Every time an H-level rear-half deviation signal is output, its value is subtracted and the output of the integrator is thereby decreased.

An output of the integrator when the value of the H-level rear-half deviation signal corresponding to the 8-th pulse of the input signal fin has been subtracted is a deviations integration result, and is output as a pulse width $T_o$ of a deviation integration signal in response to a deviation output instruction signal.

Next, a frequency measurement procedure of the frequency measuring apparatus 100 according to the embodiment will be described with reference to a flowchart of FIG. 5. First, at step S11, before a start of a frequency measurement, a number n is set, wherein n is the number of cycles of a synchronized input signal as well as the number of measurements. For example, the number of rising edges of a synchronized input signal in a prescribed reference time T (sec) can be set as the number n.

Figure 6:
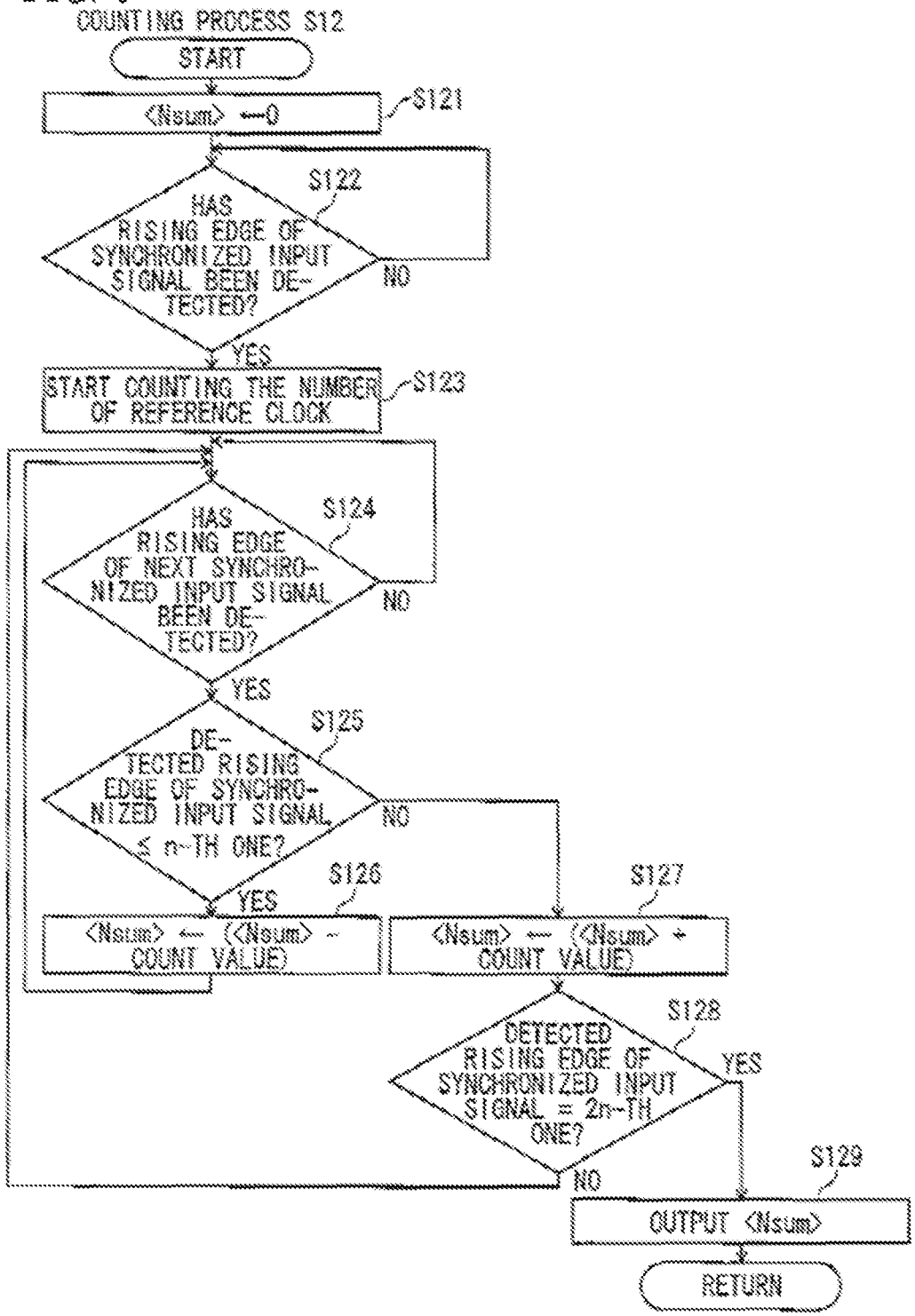
FIG. 6 is a flowchart of a procedure of a counting process.

Upon a start of a frequency measurement, a counting process (S12) and a deviation compensation process (S13) are executed in parallel. A procedure of the counting process (S12) for counting $\langle N_{sum} \rangle$ will be described below with reference to FIG. 6.

In the counting process (S12), first, $\langle N_{sum} \rangle$ is initialized to 0 at step S121. When a first rising edge of a synchronized input signal is detected (S122: yes), at step S123 counting of the number of reference clocks is started.

When the next rising edge is detected (S124: Yes), if the detected rising edge is the n-th one or less (S125: Yes), at step S126 the count is subtracted from the current $\langle N_{sum} \rangle$. If the detected rising edge is the n-th one or more (S125: No), at step S127 the count is added to the current $\langle N_{sum} \rangle$. If the detected rising edge is the 2n-th one (S128: yes), at step S129 $\langle N_{sum} \rangle$ is output as a counting result.

Figure 7:
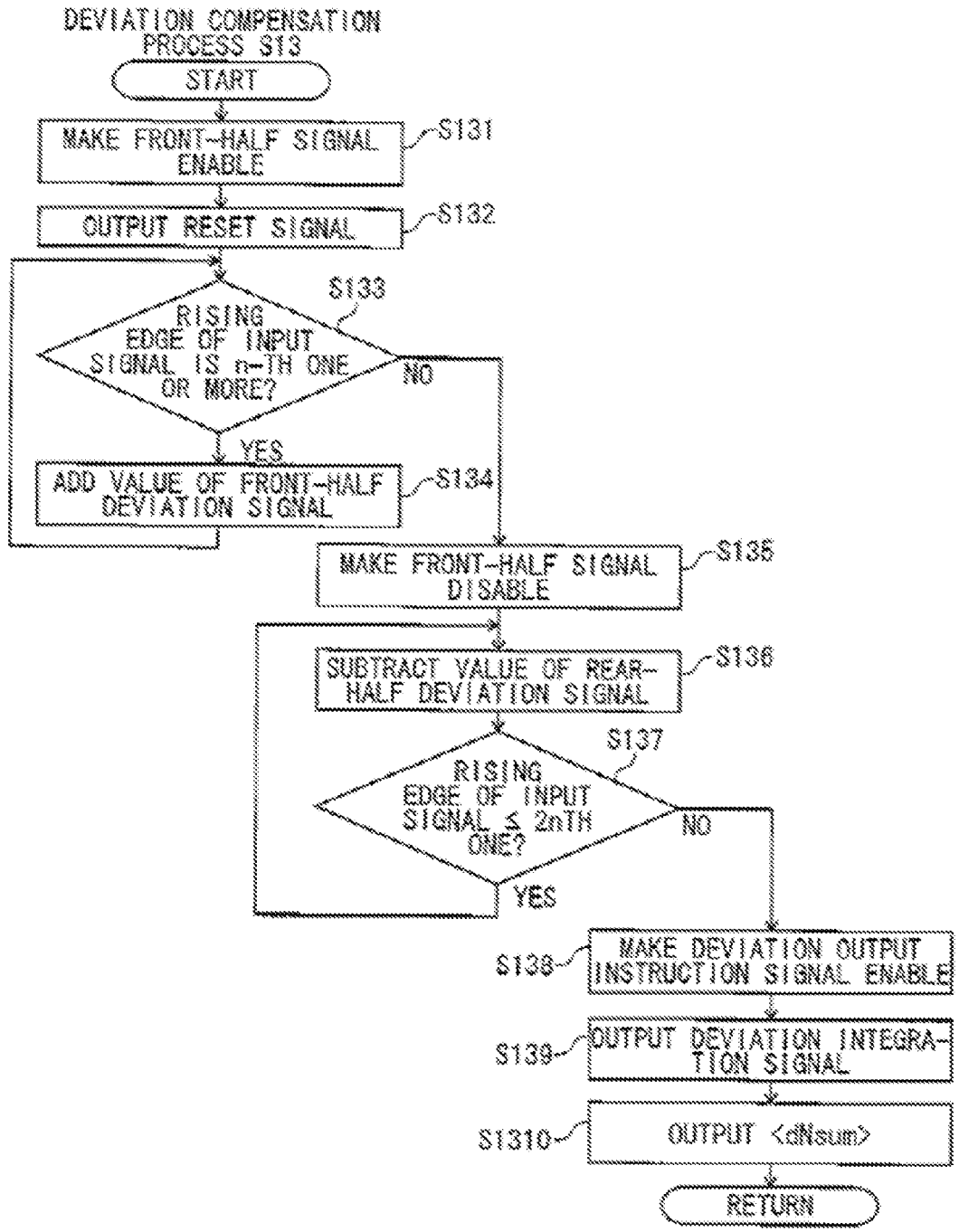
FIG. 7 is a flowchart of a procedure of a deviation compensation process.

Next, a procedure of the deviation compensation process (S13) for calculating $\langle dN_{sum} \rangle$ will be described with reference to FIG. 7. In the deviation compensation process (S13), first, the timing controller 144 makes a front-half signal enable at step S131 and outputs a reset signal at step S132. If a rising edge of the input signal is the n-th one or less (S133: Yes), at step S134 the deviation signal generating circuit 141 outputs an H-level front-half deviation signal and its value is added by the deviations integration circuit 142.

If the rising edge of the input signal is the n-th one or more (S133: No), at step S135 the timing controller 144 makes the front-half signal disable. As a result, at step S136, the deviation signal generating circuit 141 outputs an H-level rear-half deviation signal and its value is subtracted by the deviations integration circuit 142.

If the rising edge of the input signal is later than 2n-th one (S137: no), at step S138 the timing controller 144 makes a deviation output instruction signal enable. As a result, at step S139, an integration result is output as a pulse width $T_o$ of a deviation integration signal. At step S1310, the pulse width $T_o$ is converted into $\langle dN_{sum} \rangle$.

Figure 5:
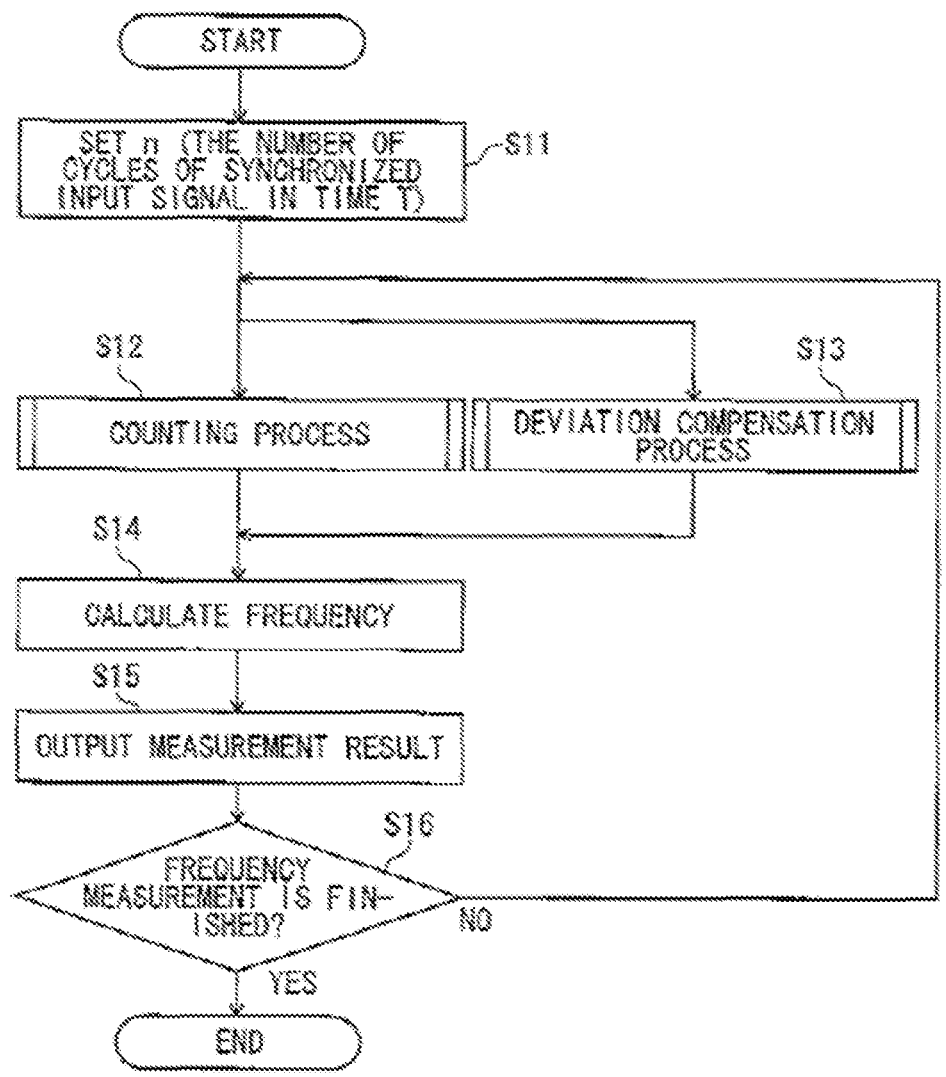
FIG. 5 is a flowchart of a frequency measurement procedure of the frequency measuring apparatus according to the embodiment.

Returning to the flowchart of FIG. 5, when $\langle N_{sum} \rangle$ has been counted by the counting process (S12) and $\langle dN_{sum} \rangle$ has been calculated by the deviation compensation process (S13), the computing circuit 130 calculates a frequency of the input signal at step S14 and outputs it as a measurement result at step S15. The above steps are repeatedly performed until it is determined that the frequency measurement should be finished (S16: Yes). As a result, the measurement result is updated quickly and a latest frequency can be acquired.

Incidentally, the embodiment has been described above with the assumption that the output of the integrator is larger than Vcc/2, that is, Inequality (10) holds. However, actually, at the end of the integration, the integration result becomes negative and the output of the integrator becomes smaller than Vcc/2 at a probability of 50%. In this case, in the circuit configuration of FIG. 3, the comparator CMP cannot output a deviation integration signal having a pulse width that corresponds to an integration result.

Therefore, in implementation of the frequency measuring apparatus 100, a certain measure needs to be taken which makes it possible to output an integration result correctly even if it is negative. One such measure is to add a circuit for determining whether an integration result is positive or negative and a comparator that is opposite in polarity to the above-described comparator CMP. If an integration result is negative, switching is made to the additional comparator and whether the magnitude of the integration result is smaller than a reference value. Another measure is to store a prescribed amount of charge in the capacitor C and subtract a value corresponding to this amount of charge from a deviation calculation result.

Still another measure is to cause the deviation signal generating circuit 141 to perform processing for making an integration result always become positive. More specifically, as expressed by Inequality (14), an H-level front-half deviation signal is elongated by one cycle of the reference clock to forcibly make an integration result positive.

$$\sum_{i=1}^{n}(dP_i+1) - \sum_{i=n+1}^{2n} dP_i > 0 \qquad (14)$$

Figure 8:
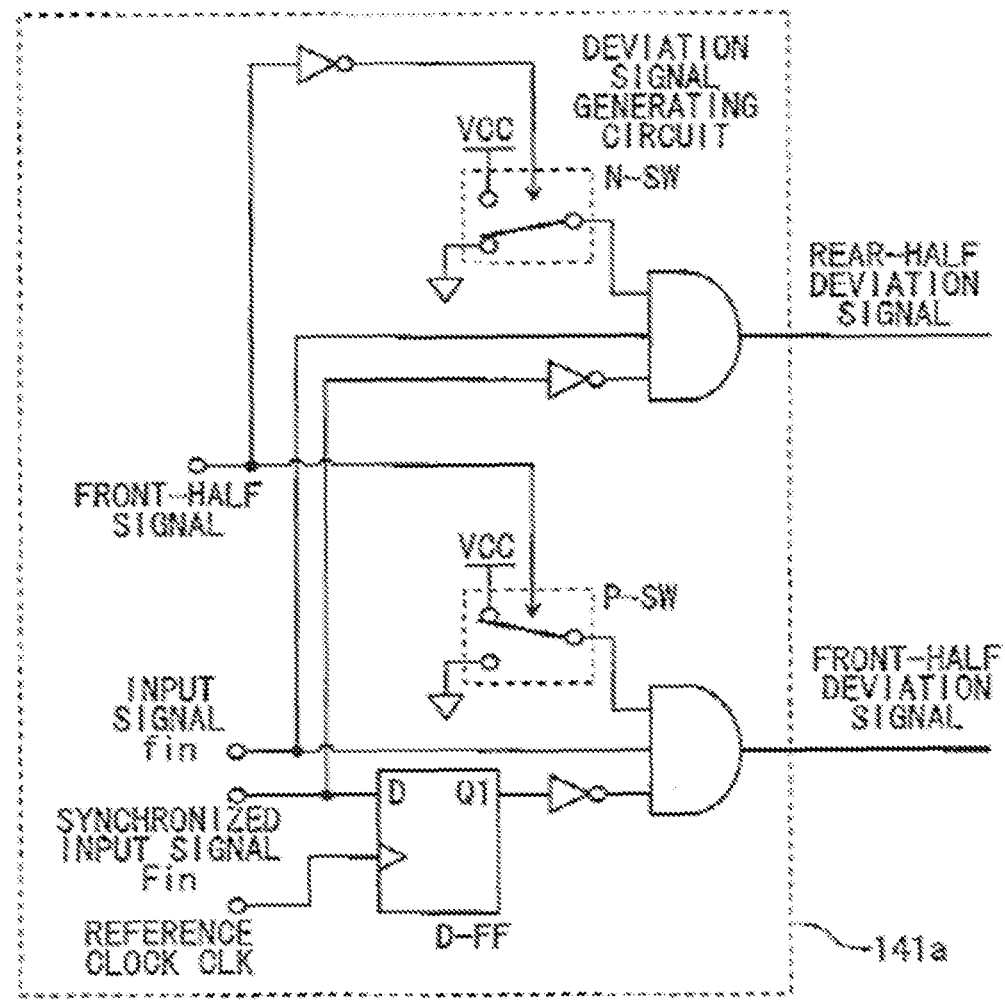
FIG. 8 is a circuit diagram showing an example configuration of a deviation signal generating circuit which elongates an H-level front-half deviation signal.
Figure 9:
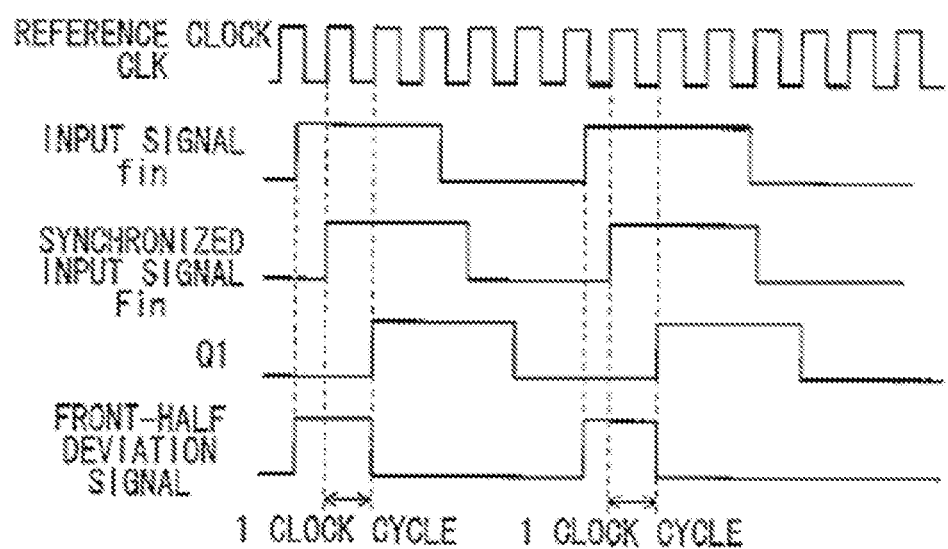
FIG. 9 is a timing chart showing H-level front-half deviation signals each of which is elongated by one pulse cycle of a reference clock.

FIG. 8 is a circuit diagram showing an example configuration of such a deviation signal generating circuit 141a. In this example, a synchronized input signal Fin is input to a D flip-flop which operates on the reference clock CLK. As can be seen from a timing chart of FIG. 9, each resulting H-level front-half deviation signal is elongated by one cycle of the reference clock CLK.

In this case, an output $\langle dN_2 \rangle$ of the compensation counting circuit 143 is given by Equation (15) and a frequency $v_{fin}$ of the input signal fin is calculated according to Equation (16):

$$\langle dN_2 \rangle = int\left\{ A\left( \sum_{n=1}^{n}(dP_i+1) - \sum_{i=n+1}^{2n} dP_i \right)\right\} \qquad (15)$$

$$v_{fin} = \frac{n}{\frac{\langle N_{sum} \rangle}{n} + \frac{\langle dN_2 \rangle}{nA} - 1} v_{CLK} \qquad (16)$$

Figure 10:
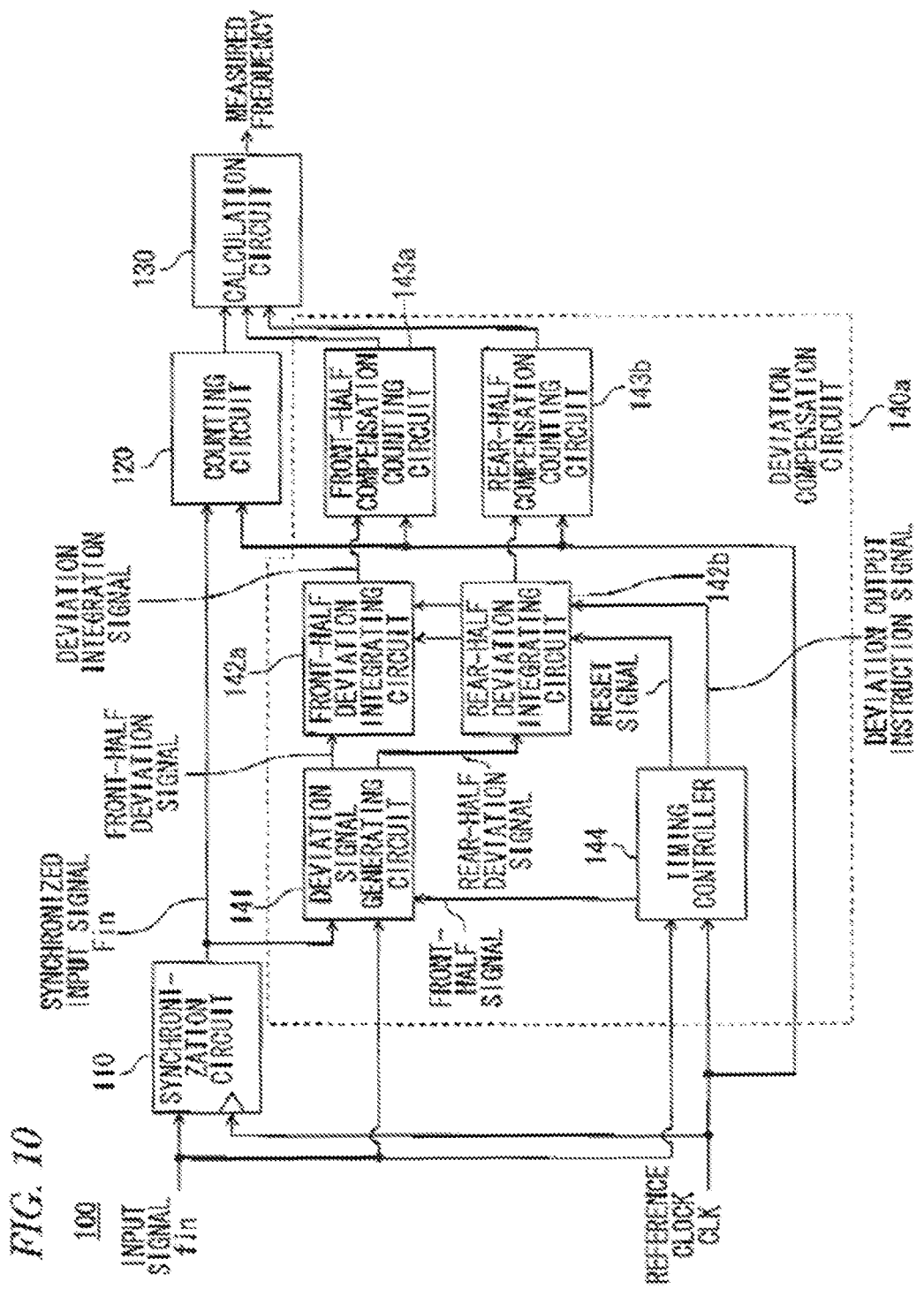
FIG. 10 is a black diagram showing an example configuration for processing a front-half deviation signal and a rear-half deviation signal separately.

FIG. 10 shows a further measure in which each of the deviation integrating circuit 142 and the compensation counting circuit 143 is divided into a circuit for front-half deviation and a circuit for rear-half deviation. In this case, front-half deviation signals are integrated by a front-half deviation integrating circuit 142a and a front half deviation integration signal is generated by a front-half compensation counting circuit 143a. Rear-half deviation signals are integrated by a rear-half deviation integrating circuit 142b and a rear half deviation integration signal is generated by a rear-half compensation counting circuit 143b.

Figure 11:
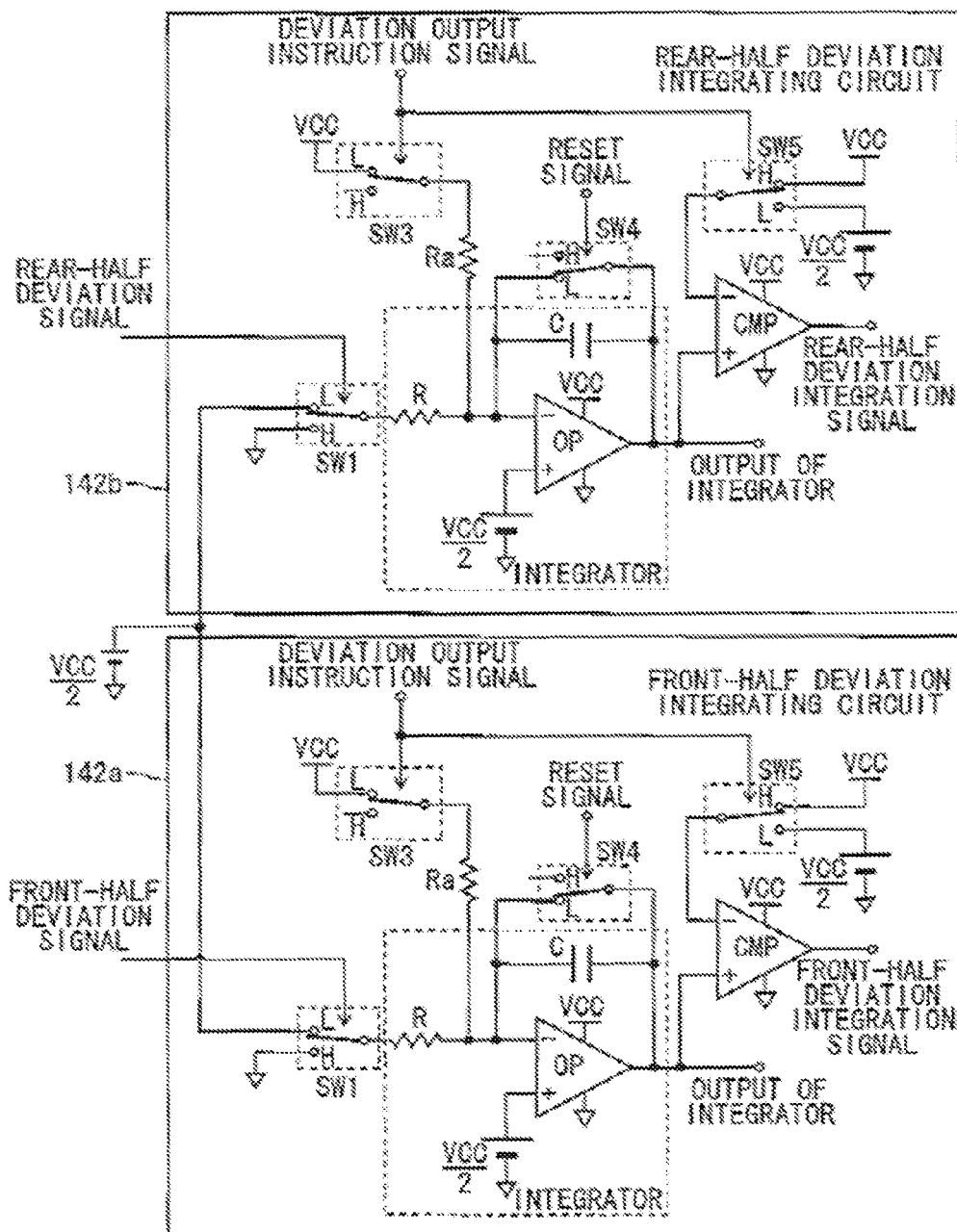
FIG. 11 is a circuit diagram showing example configurations of a front-half deviation integrating circuit and a rear-half deviation integrating circuit.

As shown in FIG. 11, the front-half deviation integrating circuit 142a and the rear-half deviation integrating circuit 142b can have the same circuit configuration. In this case, both of a front-half deviation integration value and a rear-half deviation integration value have a positive value and a corresponding front-half deviation integration signal and rear-half deviation integration signal are output from respective comparators CMP.

Figure 12:
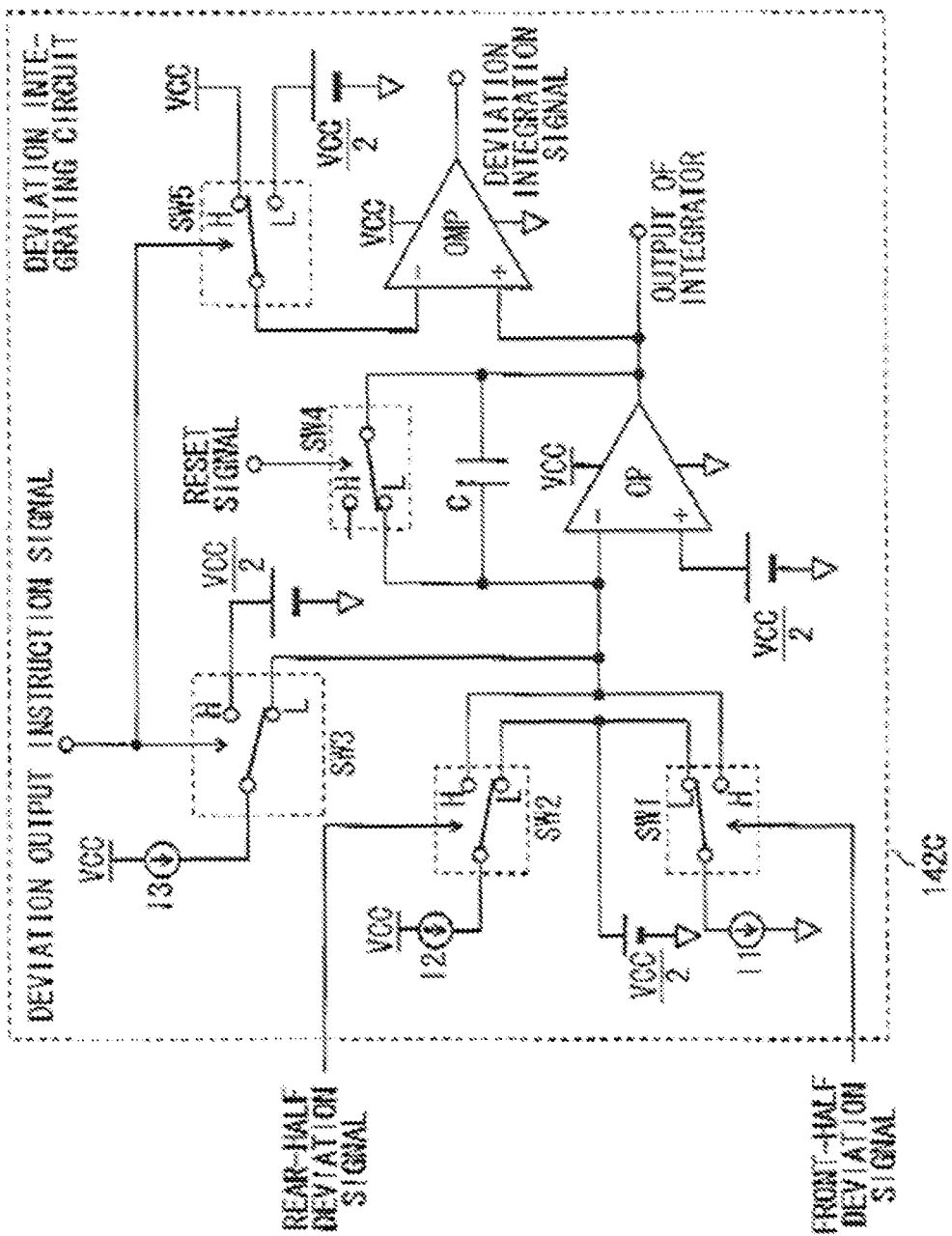
FIG. 12 is a circuit diagram showing an example configuration of a deviation integrating circuit which uses current sources.
Figure 13:
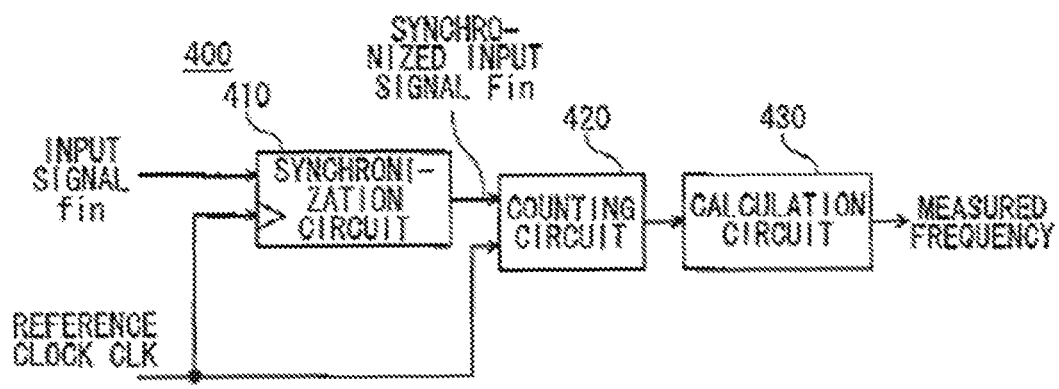
FIG. 13 is a block diagram showing the configuration according to a related-art frequency measuring apparatus.
Figure 14:
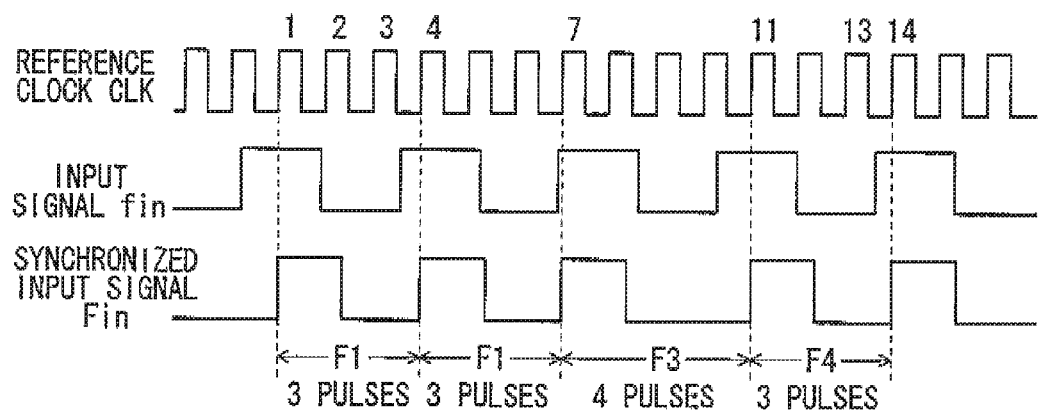
FIG. 14 is a timing chart in the related art illustrating a relationship between a reference clock, an input signal fin, and a synchronized input signal.
Figure 15:
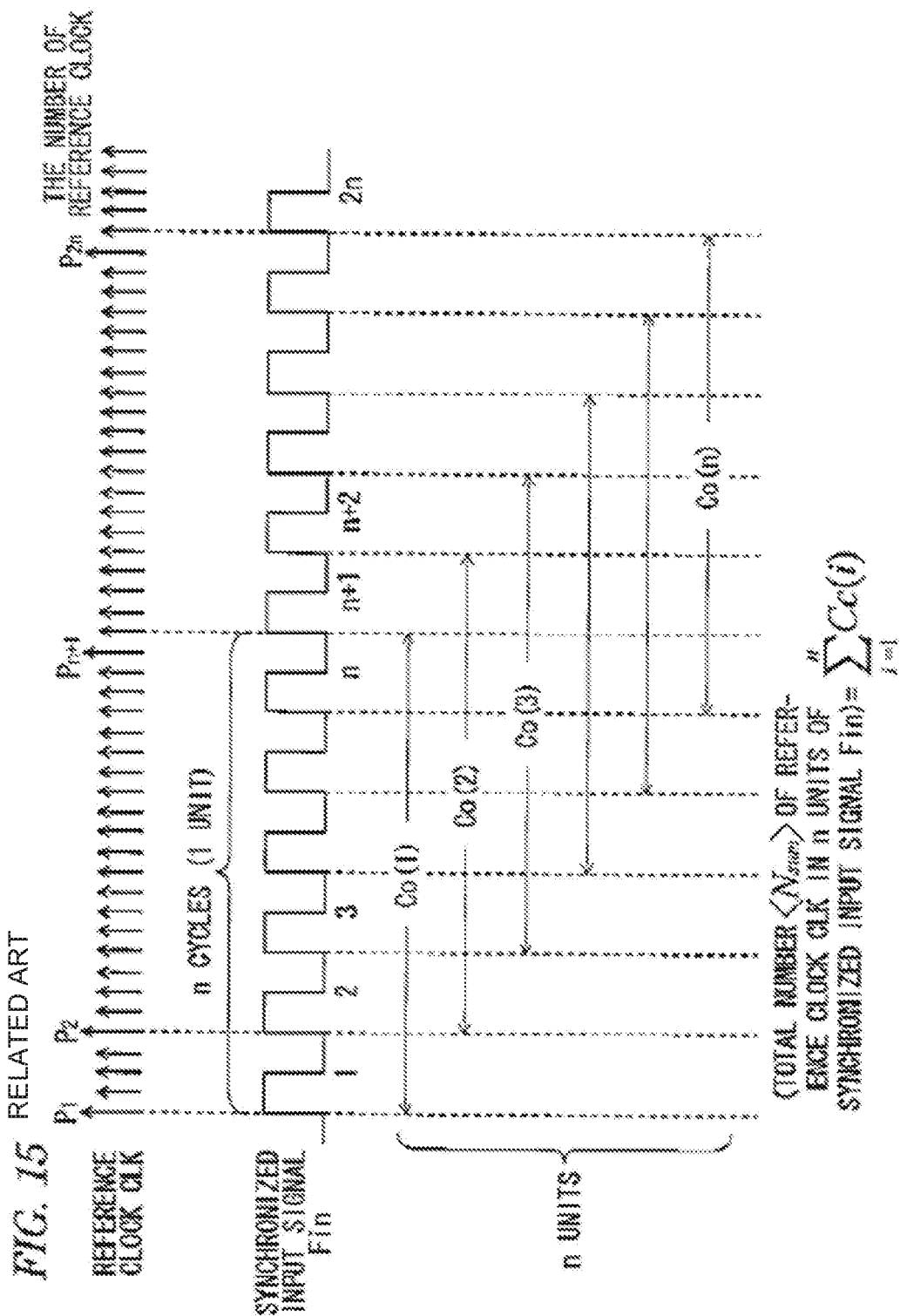
FIG. 15 is a timing chart illustrating how plural measurements are performed in parallel.

A frequency $v_{fin}$ of the input signal fin is calculated according to Equation (17) where $\langle dNa \rangle$ and $\langle dNb \rangle$ are outputs of the front-half compensation counting circuit 143a and the rear-half compensation counting circuit 143b:

$$v_{fin} = \frac{n}{\frac{\langle N_{sum} \rangle}{n} + \frac{\langle dNa \rangle - \langle dNb \rangle}{nA}} v_{CLK} \qquad (17)$$

Where the integrator of the deviation integrating circuit 142 is composed of resistors, its switching performance may be lowered by parasitic capacitances that are parallel with the respective resistors. In such a case, as shown in FIG. 12, a high-speed operation is expected by replacing the resistors with current sources I1-I3.

Although the above description is directed to the case that consecutive pulses of an input signal are processed, pulses to be processed of an input signal may be non-consecutive ones. For example, odd-numbered pulses of an input signal are to be processed, the reference clock CLK can be counted according to Equation (18). In Equation (18), <Nro> is an average of the number of pulses of the reference clock CLK included in one unit of odd-numbered pulses of an input signal fin and is a real quantity to be measured. <No> is a value counted by the counting circuit 120 obtained by processing odd-numbered pulses of a synchronized input signal. <dNo> is an output of the deviation compensation circuit 140 obtained for the odd-numbered pulses of then input signal fin.

$$\langle Nro \rangle = \frac{2}{n}\{Rc(1) + Rc(3) + \ldots + Rc(n-1)\} \quad (18)$$

$$= \frac{2}{n}\sum_{i=1}^{\frac{n}{2}} Rc(2i-1)$$

$$= \frac{2}{n}\left(-\sum_{i=1}^{\frac{n}{2}} P_{2i-1} + \sum_{i=\frac{n}{2}+1}^{n} P_{2i-1}\right) + \frac{2}{n}\left(\sum_{i=1}^{\frac{n}{2}} dP_{2i-1} - \sum_{i=\frac{n}{2}+1}^{n} dP_{2i-1}\right)$$

$$= \frac{2\langle No \rangle}{n} + \frac{2\langle dNo \rangle}{n}$$

While certain embodiments have been described, these embodiments have been presented by way of example only, and are not intended to limit the scope of the invention. Indeed, the novel methods and systems described herein may be embodied in a variety of other forms. Furthermore, various omissions, substitutions and changes in the form of the methods and systems described herein may be made without departing from the sprit of the invention. The accompanying claims and their equivalents are intended to cover such forms or modifications as would fall within the scope and sprit of the invention.

What is claimed is:

1. A physical quantity measuring apparatus (100) comprising:
    a synchronization unit (110) configured to generate a synchronized input signal from an input signal having a continuous pulse train, wherein the synchronized input signal is synchronized with a reference clock;
    a counter (120) configured to measure a total number ($N_{sum}$) that is the sum of pulses of the reference clock included in each of n units of the synchronized input signal, wherein each unit of the synchronized input signal has n cycles of the synchronized input signal, and n is a positive integer of 1 or more;
    a deviation signal generator (141) configured to generate 2n deviation signals based on a delay of the synchronized input signal with respect to the input signal;
    a deviation integrating unit (142) configured to generate a deviation integration signal by subtracting the total values of n rear-half deviation signals from the total values of n front-half deviation signals in the 2n deviation signals;
    a compensation counter (143) configured to convert the deviation integration signal into a number ($dN_{sum}$) of pulses of the reference clock; and
    a calculator (130) configured to calculate the average number ($Nr_{ave}$) of pulses of the reference clock included in one unit of the input signal, based on the total number ($N_{sum}$), the number ($dN_{sum}$), and the number n, wherein one unit of the input signal has n cycles of the input signal.

2. The apparatus of claim 1, wherein
    the calculator (130) is further configured to calculate a frequency of the input signal, based on the calculated average number ($Nr_{ave}$) and a frequency of the reference clock.

3. The apparatus of claim 1, wherein the deviation integrating unit (142) comprises:
    an integrator configured to store charge corresponding to the total values of the n front-half deviation signals and emit charge corresponding to the total values of the n rear-half deviation signals.

4. The apparatus of claim 3, wherein the deviation integrating unit (142) is further configured to generate a pulse whose width corresponds to an amount of charge remained in the integrator, and to generate the deviation integration signal based on the generated pulse width.

5. The apparatus of claim 4, wherein
    the deviation signal generator (141) is further configured to preliminary or gradually increase the n front-half deviation signals by a prescribed amount such that an amount of the charge stored in the integrator is larger than a reference value even after emitting the charge corresponding to the total values of the n rear-half deviation signals; and
    the calculator (130) is further configured to subtract a value corresponding to the prescribed amount in calculating the average number ($Nr_{ave}$).

6. The apparatus of claim 4, wherein
    the deviation integrating unit (142) is further configured to determine whether the amount of charge remained in the integrator is larger than or equal to a reference value, and to switch a pulse generation mechanism depending on the determination result, after emitting the charge corresponding to the total values of then rear-half deviation signals.

7. A physical quantity measuring apparatus comprising:
    a synchronization unit (110) configured to generate a synchronized input signal from an input signal having a continuous pulse train, wherein the synchronized input signal is synchronized with a reference clock;
    a counter (120) configured to measure a total number ($N_{sum}$) that is the sum of pulses of the reference clock included in each of n units of the synchronized input signal, wherein each unit of the synchronized input signal has n cycles of the synchronized input signal, and n is a positive integer of 1 or more;
    a deviation signal generator (141) configured to generate 2n deviation signals based on a delay of the synchronized input signal with respect to the input signal;
    a front-half deviation integrating unit (142a) configured to generate a front-half deviation integration signal by adding respective values of n front-half deviation signals in the 2n deviation signals;
    a rear-half deviation integrating unit (142b) configured to generate a rear-half deviation integration signal by adding respective values of n rear-half deviation signals in the 2n deviation signals;
    a front-half compensation counter (143a) configured to convert the front-half deviation integration signal into a number (dNa) of pulses of the reference clock;

a rear-half compensation counter (143*b*) configured to convert the rear-half deviation integration signal into a number (dNb) of pulses of the reference clock; and a calculator (130) configured to calculate the average number ($Nr_{ave}$) of pulses of the reference clock included one unit of the input signal, based on the total number ($N_{sum}$), the number (dNa), the number (dNb), and the number n, wherein one unit of the input signal has n cycles of the input signal.

8. A physical quantity measuring method comprising:

(a) generating a synchronized input signal from an input signal having a continuous pulse train, wherein the synchronized input signal is synchronized with a reference clock;

(b) measuring a total number ($N_{sum}$) that is the sum of pulses of the reference clock included in each of n units of the synchronized input signal, wherein each unit of the synchronized input signal has n cycles of the synchronized input signal, and n is a positive integer of 1 or more;

(c) generating 2n deviation signals based on a delay of the synchronized input signal with respect to the input signal;

(d) generating a deviation integration signal by subtracting the total values of n rear-half deviation signals from the total values of n front-half deviation signals in the 2n deviation signals;

(e) converting the deviation integration signal into a number ($dN_{sum}$) of pulses of the reference clock; and (f) calculating the average number ($Nr_{ave}$) of pulses of the reference clock included in one unit of the input signal, based on the total number ($N_{sum}$), the number ($dN_{sum}$), and the number n, wherein one unit of the input signal has n cycles of the input signal.

* * * * *